United States Patent
Sune (10) Patent No.: US 6,255,184 B1
(45) Date of Patent: Jul. 3, 2001

(54) FABRICATION PROCESS FOR A THREE DIMENSIONAL TRENCH EMITTER BIPOLAR TRANSISTOR

(75) Inventor: Ching-Tzong Sune, Hsin-chu (TW)

(73) Assignee: Episil Technologies, Inc., Hsin-Chu (TW)

( * ) Notice: Subject to any disclaimer, the term of this patent is extended or adjusted under 35 U.S.C. 154(b) by 0 days.

(21) Appl. No.: 09/385,507

(22) Filed: Aug. 30, 1999

(51) Int. Cl.$^7$ .............................................. H01L 21/331
(52) U.S. Cl. ...................... 438/337; 438/339; 438/361; 438/364
(58) Field of Search .................. 438/337, 338, 438/339, 342, 353, 361, 362, 364, 368, 564; 149/DIG. 10, DIG. 11

(56) References Cited

U.S. PATENT DOCUMENTS

| | | | |
|---|---|---|---|
| 4,547,793 | 10/1985 | Bergeron | 357/50 |
| 4,789,885 | * 12/1988 | Brighton | 438/365 |
| 4,902,639 | 2/1990 | Ford | 437/56 |
| 4,994,400 | * 2/1991 | Yamaguchi | 438/564 |
| 5,200,348 | * 4/1993 | Uchida et al. | 438/361 |
| 5,234,846 | 8/1993 | Chu et al. | 437/33 |
| 5,488,003 | 1/1996 | Chambers et al. | 437/31 |
| 5,637,911 | * 6/1997 | Yamazaki | 257/587 |
| 5,846,869 | * 12/1998 | Hashimoto et al. | 438/365 |
| 5,856,697 | 1/1999 | Chambers et al. | 257/378 |
| 5,869,881 | 2/1999 | Lee et al. | 257/586 |
| 6,100,799 | * 8/2000 | Huang | 438/337 |

* cited by examiner

*Primary Examiner*—Michael Trinh
(74) *Attorney, Agent, or Firm*—George O. Saile; Stephen B. Ackerman

(57) ABSTRACT

A process for fabricating a bipolar junction transistor, featuring an N type, polysilicon emitter structure, located in an emitter trench, and featuring a narrow width. P type base region, located directly underlying an N type, emitter region, which is formed in the semiconductor substrate, along the vertical and horizontal sides of the emitter trench, has been developed. The process features forming an emitter trench in a semiconductor substrate, followed by a large angle ion implantation procedure, used to form a P type, base region, in an area of the semiconductor substrate located along the sides of the emitter trench. Formation of a polysilicon emitter structure, followed by an anneal cycle, create a narrow width, emitter region, underlying the polysilicon emitter structure, also resulting in the formation of a narrow width, P type base region, located between the overlying N type emitter region, and an underlying N type, epitaxial silicon layer.

25 Claims, 7 Drawing Sheets

FABRICATION PROCESS FOR A THREE DIMENSIONAL TRENCH EMITTER BIPOLAR TRANSISTOR

BACKGROUND OF THE INVENTION (1) Field of the Invention

The present invention relates to methods used to fabricate semiconductor devices, and more specifically to a method used to fabricate a bipolar transistor device, featuring a three dimensional trench emitter region.

(2) Description of Prior Art

Although complimentary metal oxide semiconductor, (CMOS), devices have been extensively used to fabricate integrated circuits, bipolar devices, exhibiting faster switching speeds than CMOS devices, are now being used to increase the performance of bipolar-CMOS, (BiCMOS), designs, when compared to counterpart designs entailing only CMOS devices. In addition advances in bipolar configurations, such as emitter regions obtained from diffusion from overlying polysilicon emitter structures, compared to conventional emitter regions, obtained via ion implantation, directly into the semiconductor substrate, have allowed improved bipolar devices to be realized. For example the depth of emitter regions, formed from polysilicon emitter structures, can be maintained at narrower levels than emitter regions obtained via direct ion implantation procedures. This is a result of the absence of ion implantation channelling, and as a result of the elimination of a post-ion implant anneal, sometimes resulting in excessive drive-in of the emitter, into the base region. Therefore the use of the more controllable polysilicon emitter structure, has allowed the attainment of narrower base widths, which in results in higher performing bipolar device, in terms of frequency response, (Ft).

The emitter resistance is in part, a function of the level of interface area between the emitter, and underlying base region. However increasing the interface area directly increases the dimensions of the bipolar device, adversely influencing the objective of device miniaturization. This invention will describe the fabrication of a bipolar device, featuring a trench, polysilicon emitter structure, maximizing interface area while minimizing device area. In addition this invention will describe a novel procedure used to fabricate a narrow base region, along the sides of the emitter trench region. Prior art, such as Chambers et al, in U.S. Pat. No. 5,488,003, as well as Chambers et al, in U.S. No. 5,856,697, describe procedures used to create polysilicon emitter structures, located in a trench, however these prior arts do not teach the novel procedure described in this present invention, of forming narrow base widths, along the sides of the emitter trench, prior to the polysilicon filling of the emitter trench.

SUMMARY OF THE INVENTION

It is an object of this invention to fabricate a bipolar device featuring a three dimensional, trench, polysilicon emitter structure.

It is another object of this invention to form a narrow width base region, along the sides of an emitter trench, prior to formation of the trench, polysilicon emitter structure.

In accordance with the present invention a method of fabricating a bipolar junction transistor, featuring a three dimensional, polysilicon emitter trench structure, and featuring a narrow width base region, formed along the sides of the emitter trench, prior to the formation of the polysilicon emitter structure, is described. After creation of deep trench isolation regions, in the semiconductor substrate, and creation of field oxide, isolation regions, in an N type epitaxial silicon layer, an emitter trench is formed in the N type epitaxial layer, in a first region of the semiconductor substrate, located between two field oxide regions. A P type, base region is next formed in the exposed regions N type epitaxial silicon layer, in a first region of the semiconductor substrate, including formation of the P type, base region in the region of the semiconductor substrate located along the sides of the emitter trench. An N type, polysilicon emitter structure is next defined, overlying the region of the P type, base region, located along the sides of the emitter trench. An anneal cycle is then used to diffuse N type dopant from the N type, polysilicon emitter structure, into a top portion of P type base region, resulting in a narrow width, P type base region, comprised of the uncompensated region of the P type, base region. After creation of insulator spacers, on the sides of the portion of the N type, polysilicon emitter structures, not located in the emitter trench, diffused, P type contact regions, are formed, placed in a region of the semiconductor substrate, located between the field oxide regions, and the insulator spacers. P type, polysilicon contact structures are then formed overlying the P type, contact regions, as well as overlying the field oxide regions, located adjacent to the emitter trench. After deposition of, and planarization of, a dielectric layer, contact openings are made in the dielectric layer, exposing a portion of the top surface of the N type, polysilicon emitter structure, as well as exposing a portion of the top surface of a P type, polysilicon contact structure. Another trench region, used for a collector trench, is also formed in the dielectric layer, and in a second region of the semiconductor substrate, located between another set of field oxide regions. Metal contact structures are then formed, resulting in: a base contact structure, overlying and contacting the P type, polysilicon contact structure; an emitter contact structure, overlying and contacting the N type, polysilicon emitter structure; and resulting in a collector contact structure, located in the opening in the dielectric layer, and in the collector trench, overlying and contacting a buried N type subcollector layer, located underlying the N type epitaxial layer.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
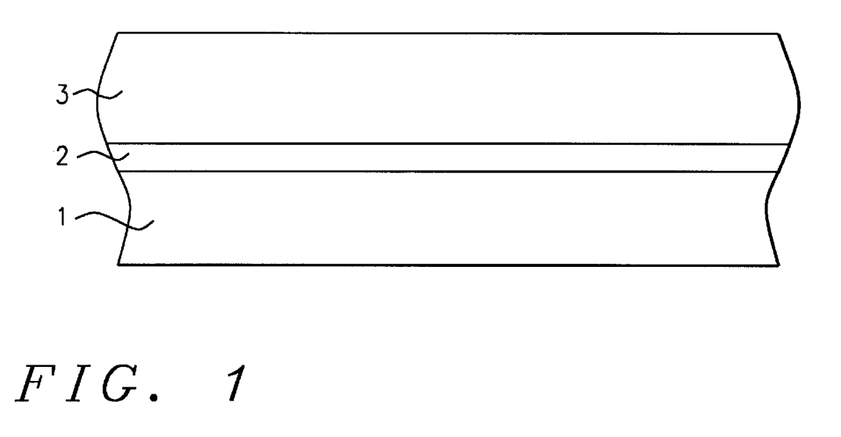
FIGS. 1–14, which schematically, in cross-sectional style, show key stages of fabrication, used to create a bipolar junction transistor, featuring a polysilicon emitter structure, located in an emitter trench, and a narrow width base region, located in the semiconductor substrate, along the sides of the emitter trench.

The method of fabricating a bipolar junction transistor, featuring a polysilicon emitter structure, partially located in an emitter trench, and featuring a narrow width base region, located in a region of the semiconductor substrate, along the sides of the emitter trench, will now be described in detail. A P type, semiconductor substrate 1, comprised of single crystalline silicon, with a <100> crystallographic orientation, is used and schematically shown in FIG. 1. An N+ region 2, used as a buried subcollector region, is next formed via ion implantation of arsenic, antimony, or phosphorous ions, at an energy between about 30 to 150 KeV, and at a dose between about 1E15 to 5E15 atoms/cm$^2$, then subjected to a high temperature drive-in procedure. After a series of wet cleans, including an hydrofluoric acid step, an N type, epitaxial silicon layer 3, is grown, at a temperature between about 1000 to 1200° C., to a thickness between about 1 to 10 um, using trichlorosilane as a source, with the addition of arsine, or phosphine, resulting in a surface dopant concentration for N type, epitaxial silicon layer 3, between about 1E15 to 5E16 atoms/cm$^3$.

Figure 2:
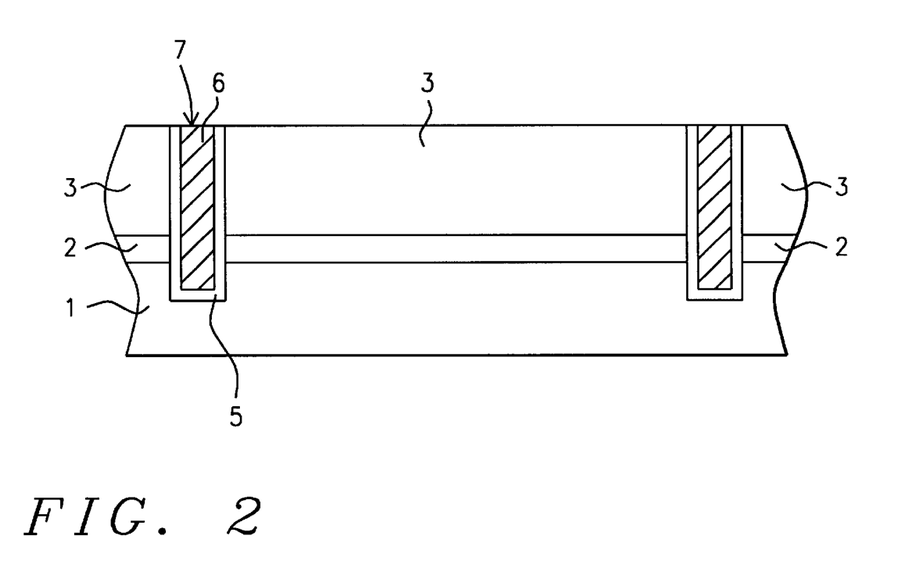

FIG. 2, schematically shows the formation of trench isolation regions 7, used to isolate a specific, subsequent, bipolar junction transistor, (BJT), from adjacent devices. The trench isolation regions are formed by creating trench shapes in semiconductor substrate 1, via conventional photolithographic and anisotropic, reactive ion etching, (RIE), procedures, using $Cl_2$, or $SF_6$, as an etchant. The trench shapes are formed through N+ region 2, into P type, semiconductor substrate 1, to a depth between about 2 to 12 um, with a width between about 0.5 to 3 um. Isolation can be achieved via complete filling of the trench shapes with an insulator layer, or as shown schematically in FIG. 2, via lining the sides of the trench shapes with insulator layer 5, then filling the trench shapes with polysilicon layer 6. Insulator layer 5, used to line the exposed surfaces of the trench shapes, can be a silicon oxide layer, obtained via low pressure chemical vapor deposition, (LPCVD), or via plasma enhanced chemical vapor deposition, (PECVD), procedures, to a thickness between about 1000 to 5000 Angstroms Polysilicon layer 6, used to completely fill the trench shapes, is obtained via LPCVD procedures, at a thickness between about 0.2 to 2 um, Removal of unwanted regions of polysilicon layer 6, and of insulator layer 5, from the top surface of N type, epitaxial silicon layer 3, is accomplished via a chemical mechanical polishing, (CMP), procedure, or via selective RIE procedures, using $Cl_2$ or $SF_6$ as an etchant for polysilicon layer 6, while using $CHF_3$ as an etchant for insulator layer 5. The use of polysilicon filled trenches reduces mismatches, and stress effects, encountered with insulator filled trenches, during subsequent high temperature processing, thus avoiding defects that are more prevalent with trenches completely filled with insulator.

Figure 3:
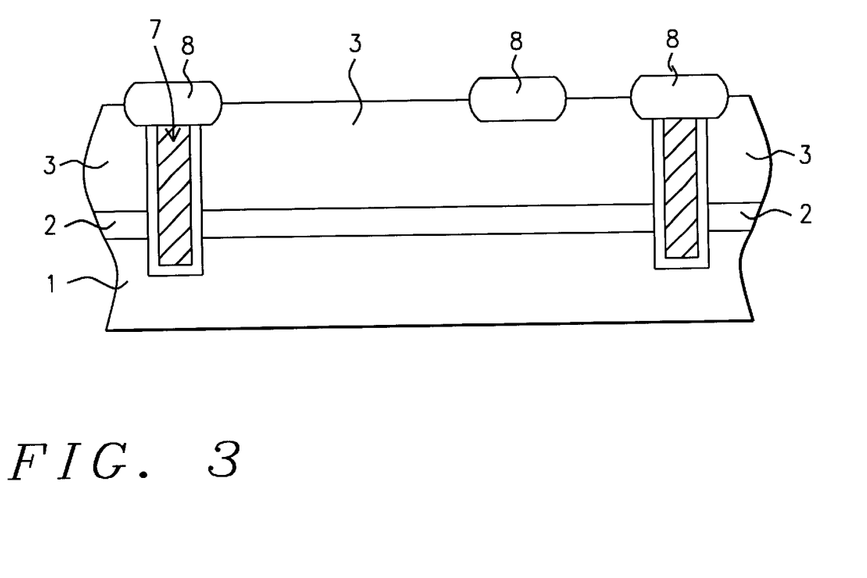

The isolation needed to separate specific elements of the bipolar junction device, field oxide regions 8, are next formed, and schematically shown in FIG. 3. An oxidation resistant masking pattern, comprised of silicon nitride, not shown in the drawings, is formed via deposition of a silicon nitride layer, via LPCVD or PECVD procedures, followed by conventional photolithographic and RIE procedures, resulting in the desired, oxidation resistant, silicon nitride masking pattern. An oxidation procedure, carried out in an oxygen-steam ambient, at a temperature between about 1050 to 1100° C., is then used to create field oxide regions 8, at a thickness between about 4000 to 6000 Angstroms, in areas of N type epitaxial layer 3, and in areas of the trench isolation regions 7, not covered by the oxidation resistant mask. After formation of field oxide regions 8, the silicon nitride, oxidation resistant mask is selectively removed via use of a hot phosphoric acid solution. If desired field oxide regions 8, can be replaced with insulator filled shallow trenches, accomplished via defining a shallow trench shape, in N type epitaxial silicon layer 3, or in trench isolation regions 7, via conventional photolithographic and RIE procedures. Filling of the shallow trench shapes is then achieved via a deposition of an insulator layer, such as silicon oxide, via LPCVD or PECVD procedures, followed by removal of unwanted regions of the insulator layer, via a chemical mechanical polishing procedure, or via a selective RIE procedure, resulting in the insulator filled shallow trench isolation regions.

Figure 4:
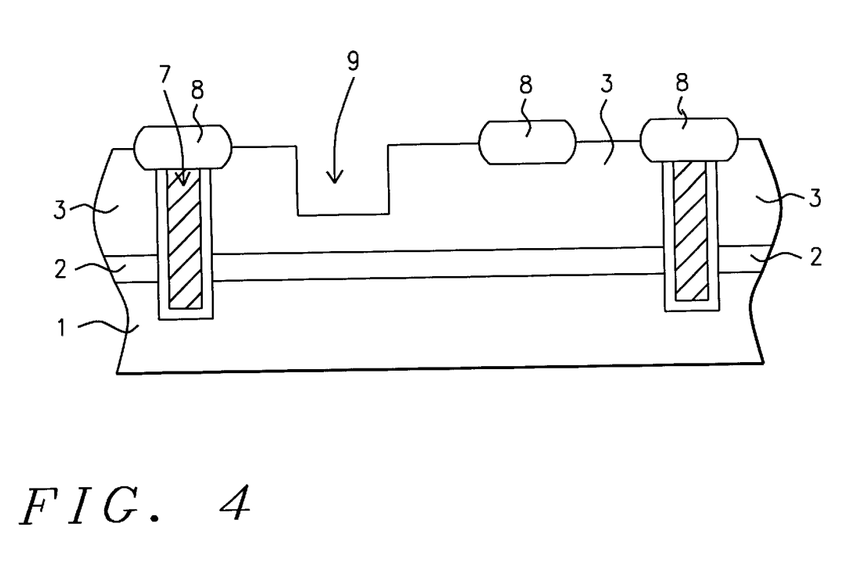

Emitter trench 9, is next formed, and shown schematically in FIG. 4. A photoresist shape, not shown in the drawings, is used as a mask to allow an anisotropic RIE procedure, using $Cl_2$ or $SF_6$ as an etchant, creating emitter trench 9, to a depth between about 0.5 to 2 um, in N type epitaxial silicon layer 3. Emitter trench 9, will allow subsequent residence for a polysilicon emitter structure. The photoresist shape, used for definition of emitter trench 9, is removed via plasma oxygen ashing and careful wet cleans.

Figure 5:
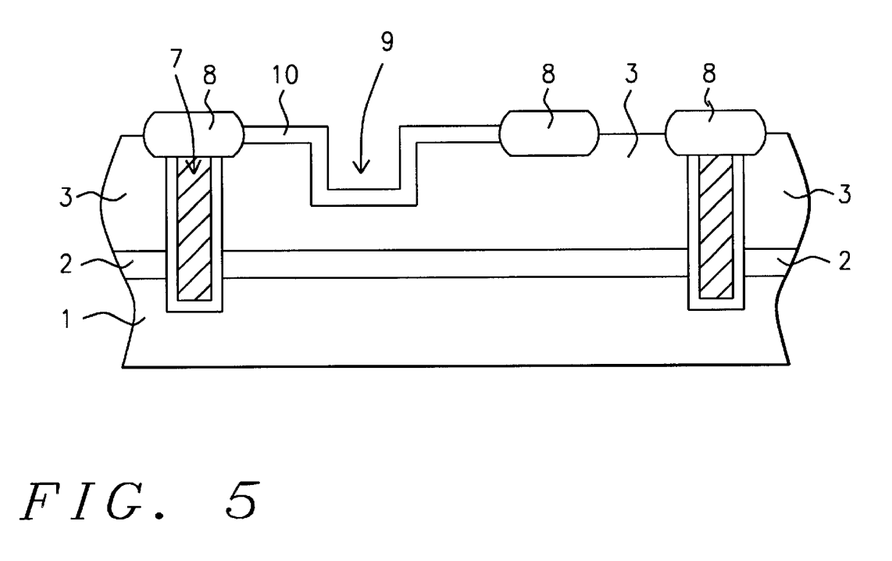

A critical P type base region 10, is next formed, and described schematically in FIG. 5. Another photoresist shape, not shown in the drawings, is used as a mask, to allow an ion implantation procedure, using boron, or $BF_2$ ions, to create P type base region 10, in regions unprotected by the photoresist mask. The ion implantation procedure is performed at an energy between about 10 to 30 KeV, at a dose between about 1E13 to 5E14 atoms/cm$^2$, and at an implant angle between about 0 to 60°, allowing P type base region 10, to form in N type epitaxial silicon layer 3, at a depth between about 1000 to 5000 Angstroms, with the implant angle allowing the depth of P type base region 10, along the vertical sides of emitter trench 9, to be equal to the depth of P type base region, along the horizontal surface of N type epitaxial layer 3. The ability to obtain the narrow depth of P type base region 10, along both the horizontal and vertical sides of emitter trench 9, will after creation of a diffused emitter region, allow a controlled, uncompensated, narrow base width, to be achieved. Removal of the photoresist shape, used for definition of P type base region 10, is again accomplished via plasma oxygen ashing and careful wet cleans, including a buffered hydrofluoric acid clean, used prior to deposition of the polysilicon layer, used for the emitter structure. Another method of obtaining P type base region 10, is via deposition of a solid source, such as borosilicate glass, or a boron doped spin on glass layer, followed by a thermal drive-in procedure, performed at a temperature between about 800 to 1000° C., using conventional furance, or rapid theram anneal, procedures. The solid source is then selectively removed using wet etch procedures. Regions not intended to accomodate the P type doping procedure were protected by a silicon oxide shape, (not shown in the drawings), prior to deposition of the solid source.

Figure 6:
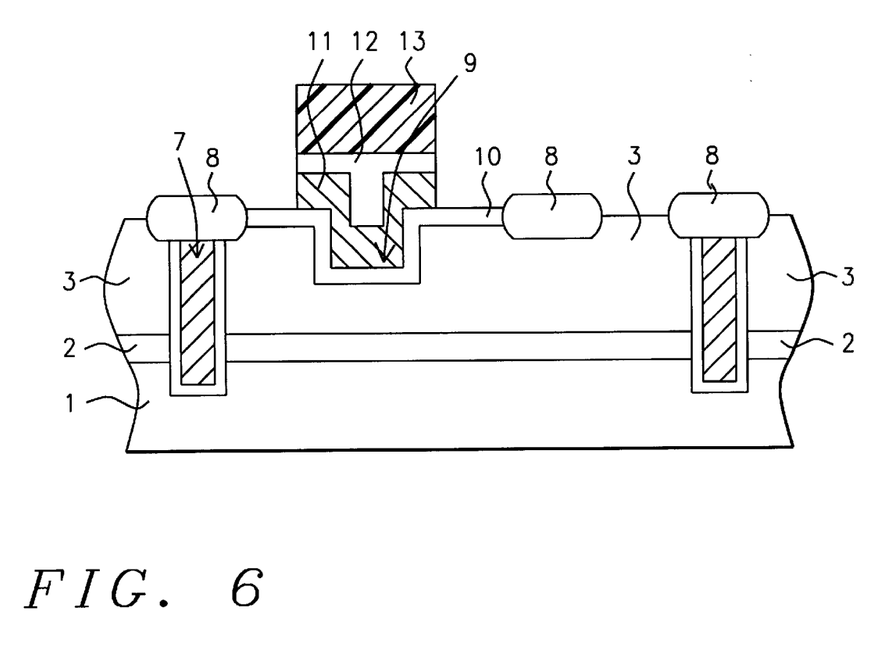

A polysilicon layer is next deposited via LPCVD procedures, at a thickness between about 3000 to 5000 Angstroms, coating the exposed sides of emitter trench 9. The doping of the polysilicon layer, critical to the magnitude of a subsequent diffused emitter region, is either accomplished in situ, during deposition, via the addition of arsine to a silane ambient, or the polysilicon layer, can be deposited intrinsically, then doped via ion implantation of arsenic ions, at an energy between about 30 to 70 KeV, at a dose between about 5E15 to 2E16 atoms/cm$^2$, resulting in a polysilicon layer with a surface concentration between about 1E20 to 3E20 atoms/cm$^3$. A silicon oxide layer is next deposited via LPCVD or PECVD procedures, to a thickness between about 2000 to 3000 Angstroms, using tetraethylorthosilicate, (TEOS), as a source. Photoresist shape 13, is then used as an etch mask allowing an anisotropic RIE procedure, using $CHF_3$ as an etchant for the silicon oxide layer, and using $Cl_2$ as an etchant for the polysilicon layer, creating polysilicon emitter structure 11, in emitter trench 9, underlying silicon oxide shape 12. This is schematically shown in FIG. 6.

Figure 7:
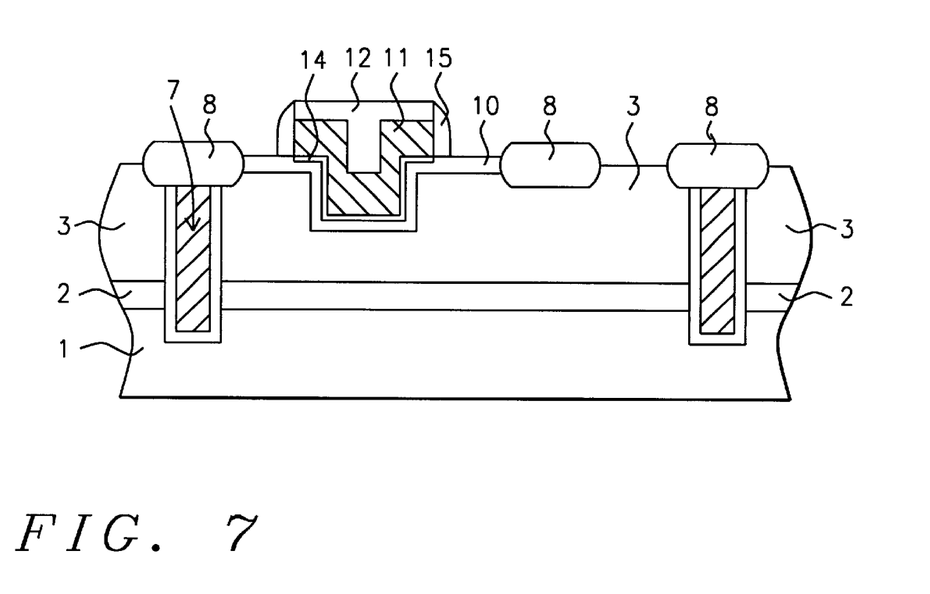

After removal of photoresist shape 13, via plasma oxygen ashing and careful wet cleans, a critical anneal procedure, performed in a conventional furnace, at a temperature between about 700 to 1000° C., for a time between about 10 to 120 min, in a nitrogen ambient, is used to create diffused emitter region 14, in a region of P type base region 10. If desired the anneal cycle can be performed using a rapid thermal anneal, (RTA), furnace. Diffused emitter region 14, at a depth between about 500 to 1500 Angstroms, shown schematically in FIG. 7, is uniform in depth in both the horizontal, as well as vertical regions of P type base region 10, with the uncompensated region of P type base region now presenting a narrow base width between about 300 to 2000 Angstroms. The narrow, and uniform base width, allows increased, and uniform switching speeds, (Ft), to be obtained, and also results in the attainment of increased, and uniform collector currents, resulting in increased transistor gains, (beta). Insulator spacers 15, shown schematically in FIG. 7, are next created on the exposed sides of polysilicon emitter structure 11. This is accomplished via the deposition of a silicon oxide layer, via LPCVD or PECVD procedures, at a thickness between about 1000 to 3000 Angstroms, followed by an anisotropic RIE procedure, using $CHF_3$ as an etchant.

Figure 8:
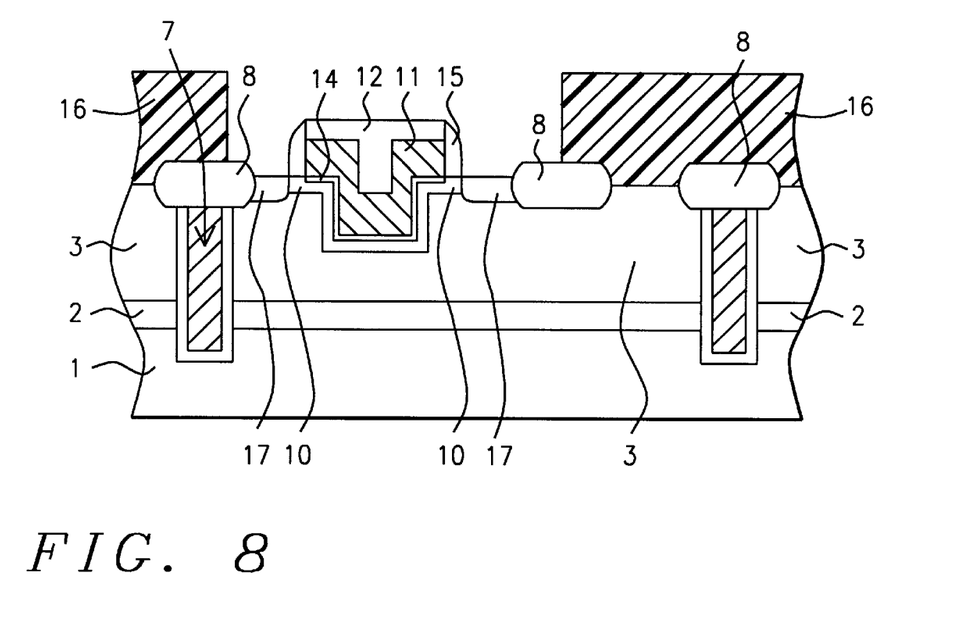
Figure 9:
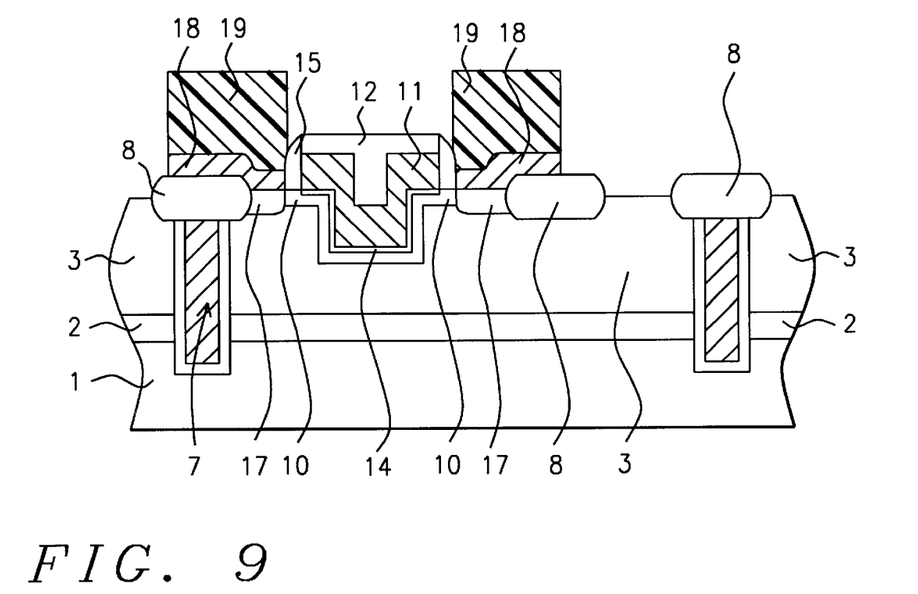

Photoresist shape 16, is next used as a mask to allow an ion implantation procedure, to create P type, base contact regions 17, schematically shown in FIG. 8. The ion implantation procedure used to create P type, base contact regions 17, is performed at an energy between about 10 to 50 KeV, at a dose between about 1E15 to 3E15 atoms/cm$^2$, using boron or BF2 ions. Photoresist shape 16, is then removed via plasma oxygen ashing and careful wet cleans. A A polysilicon layer is next deposited, to a thickness between about 3000 to 5000 Angstroms, then doped via an ion implantation procedure, using boron, or $BF_2$ ions, at an energy between about 30 to 80 KeV, at a dose between about 1E15 to 3e15 atoms/cm$^2$. Photoresist shape 19, is then used as a mask, allowing a selective RIE procedure, using $Cl_2$ or $SF_6$ as an etchant, to create P type polysilicon contact regions 18, shown schematically in FIG. 9. The use of P type, polysilicon contact regions 18, and the use of P type, base contact regions 17, will reduce the base resistance of the bipolar device, enhancing device performance. Photoresist shape 19, is removed via plasma oxygen ashing and careful wet cleans.

Figure 10:
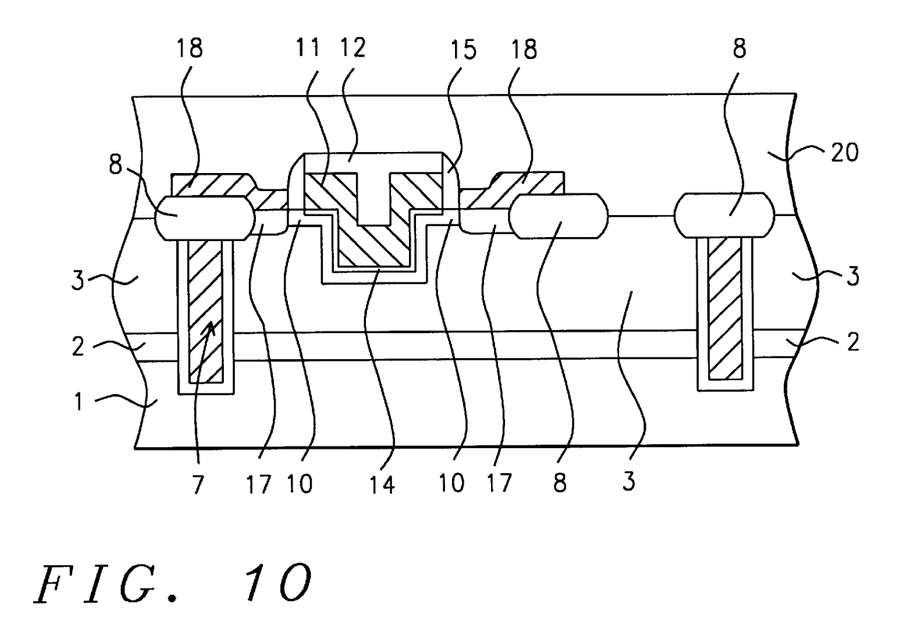
Figure 11:
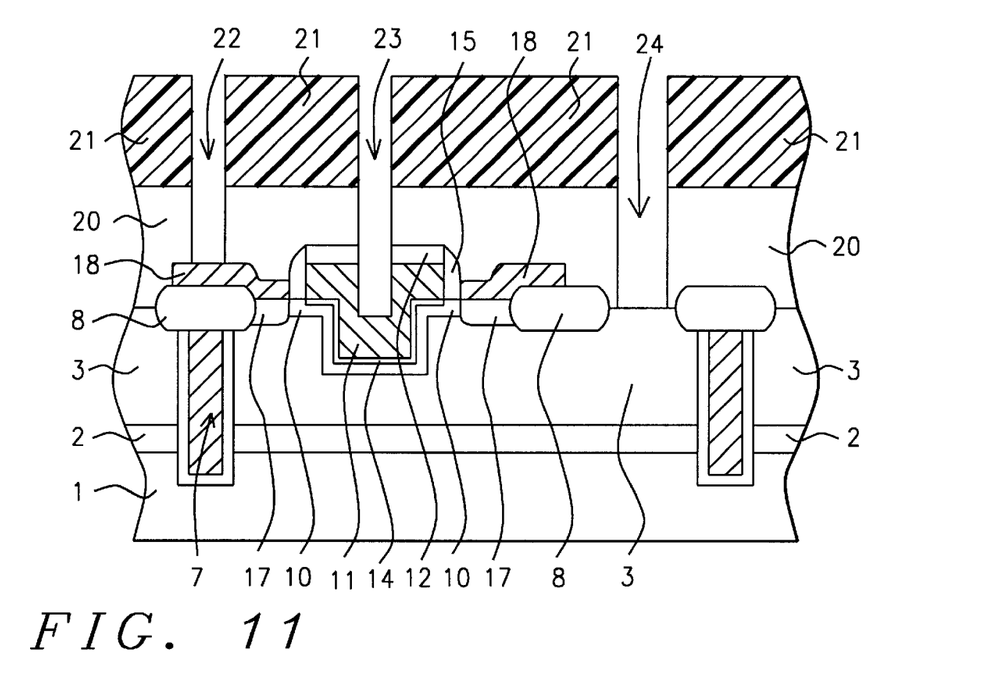
Figure 12:
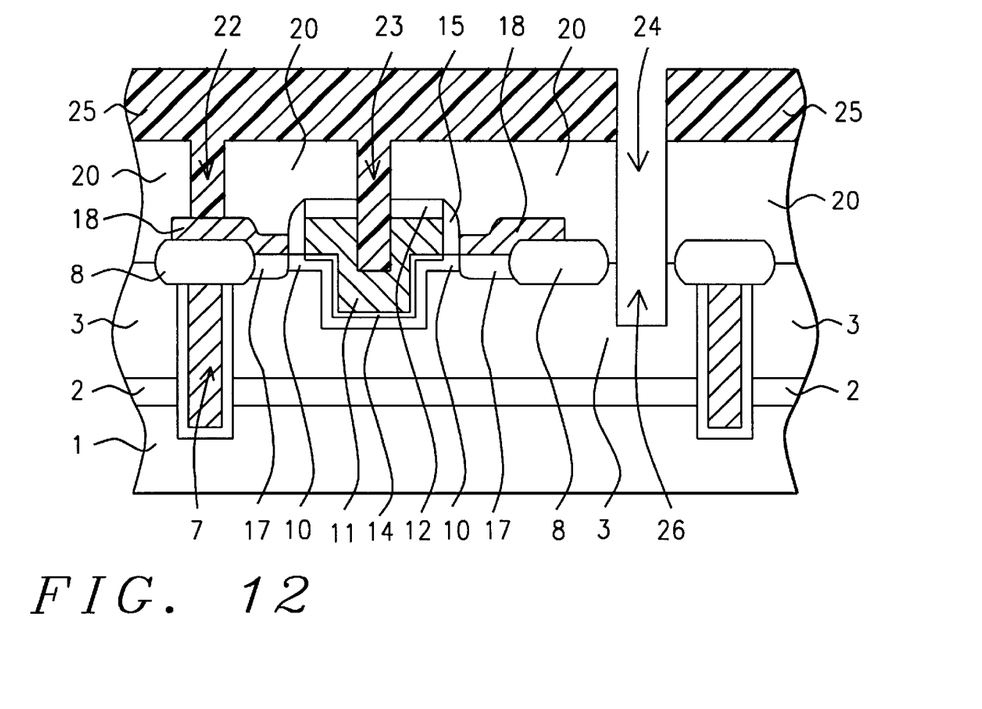

A dielectric layer 20, such as silicon oxide, or borophosphosilicate glass, (BPSG), is next deposited using LPCVD or PECVD procedures, to a thickness between about 8000 to 15000 Angstroms. A chemical mechanical polishing procedure is then employed for planarization purposes, resulting in a smooth top surface topography for dielectric layer 20. This is schematically shown in FIG. 10. Photoresist shape 21, is now formed and used as a mask to allow a selective, RIE procedure, using $CHF_3$ as an etchant: to create base contact hole opening 22, in dielectric layer 20, exposing a portion of the top surface of P type, polysilicon contact region 18; to create emitter contact hole opening 23, in dielectric layer 20, and in silicon oxide shape 12, exposing a portion of the top surface of polysilicon emitter structure 11; and to create collector opening 24, in dielectric layer 20, exposing a portion of the top surface of N type, epitaxial silicon layer 3. This is schematically shown in FIG. 11. After removal of photoresist shape 21, via plasma oxygen ashing and careful wet cleans, photoresist shape 25, is formed and used as a mask to allow an anisotropic RIE procedure, using $Cl_2$ or $SF_6$ as an etchant, to create collector trench 26, to a depth between about 1 to 7 um, in N type, epitaxial silicon layer 3. This is schematically shown in FIG. 12. The use of a collector trench, and a subsequent collector contact structure, in the collector trench, is optional. Collector trench, although not shown reaching N+ region 2, can however be formed to in fact reach N+ region 2, after after filling with a conductive material, be used as a contact to N+ region 2.

Figure 13:
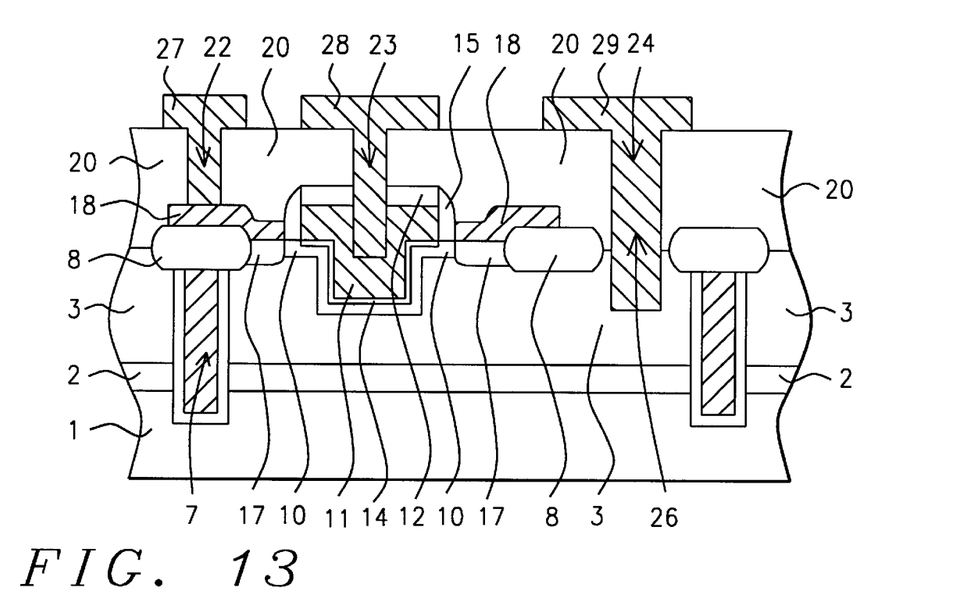

After removal of photoresist shape 25, via plasma oxygen ashing and careful wet cleans deposition of a metal layer, such as an aluminum based layer, containing both copper, and silicon, or a tungsten layer, is performed using either plasma vapor deposition, or chemical vapor deposition procedures, to a thickness between about 5000 to 10000 Angstroms, completely filling base contact hole opening 22, emitter contact hole opening 23, collector trench 26, and collector opening 24. A photoresist shape, not shown in the drawings is then used as an etch mask, allowing an anisotropic RIE procedure, using $Cl_2$ or $SF_6$ as an etchant, to create base metal contact structure 27, emitter contact structure 28, and collector metal structure, and collector metal contact structure, 29. This is schematically shown in FIG. 13. The photoresist shape used for definition of the metal contact structures is removed via plasma oxygen ashing and careful wet clean procedures.

Figure 14:
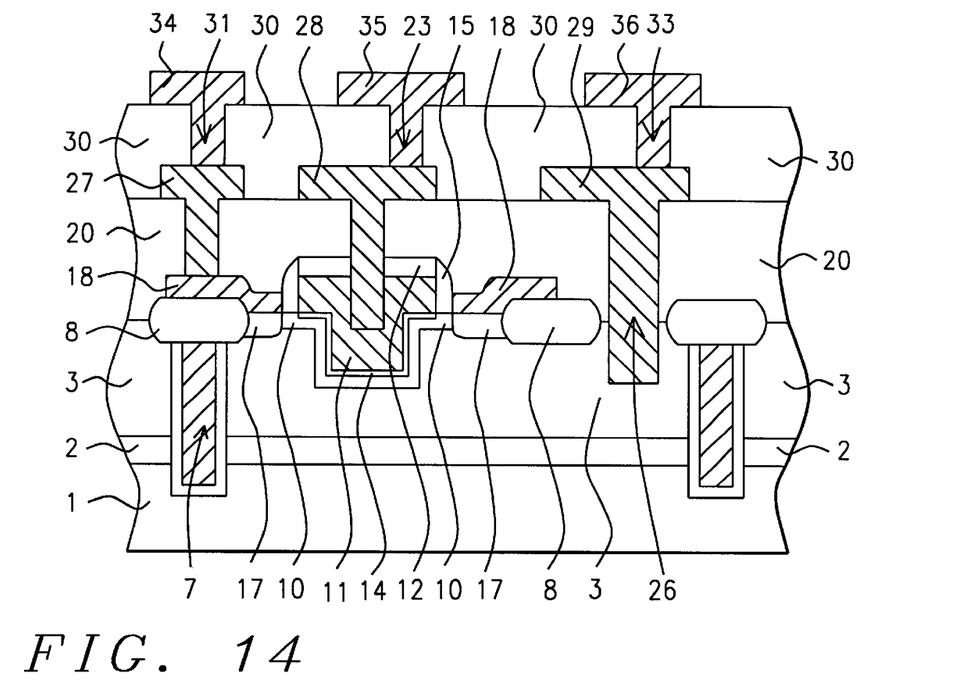

Another dielectric layer 30, comprised of either silicon oxide, or BPSG, is deposited via LPCVD or PECVD procedures, to a thickness between about 8000 to 15000 Angstroms, followed by a chemical mechanical polishing procedure, used to create a smooth top surface topography for dielectric layer 30. Conventional photolithographic and RIE procedures, using $CHF_3$ as an etchant, are used to open via holes 31, 32, and 33, to expose a portion of the top surface of base metal contact structure 27, emitter metal contact structure 28, and collector metal contact structure 29, respectfully. After removal of the photoresist shape, used for definition of the via holes, again using plasma oxygen ashing and careful wet cleans, a metal layer, such as an aluminum based layer, containing copper, or a tungsten layer, is deposited using either plasma vapor deposition, or chemical vapor deposition procedures, to a thickness between about 5000 to 10000 Angstroms, completely filling the via holes. Conventional photolithographic and anisotropic RIE procedures, using $Cl_2$ or $SF_6$ as an etchant, are again used to define second level metal structures, 34, 35, and 36. This is schematically shown in FIG. 14. The photoresist shape, used for definition of the second level metal structures is once again removed using plasma oxygen ashing and careful wet cleans.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a bipolar junction transistor, on a semiconductor substrate, comprising the steps of:

forming a subcollector region, of a first conductivity type, in a top portion of said semiconductor substrate, with said semiconductor substrate comprised with a second conductivity type;

growing an epitaxial silicon layer, of a first conductivity type, on said subcollector region; forming deep trench isolation regions in said semiconductor substrate, with said deep trench isolation regions surrounding a portion of said semiconductor substrate to be used for said bipolar junction transistor;

forming insulator isolation regions in said semiconductor substrate, isolating a first region of said semiconductor substrate, to be used for a base region for said bipolar junction transistor, and isolating a second region of said semiconductor substrate, to be used for a collector region for said bipolar junction transistor;

forming a first trench, in said first region of said semiconductor substrate, to be used as an emitter trench;

forming a base region, of a second conductivity type, in said first region of said semiconductor substrate, with a first portion of said base region located along the vertical and horizontal surfaces of said emitter trench, and with a second portion of said base region located on the top surface of said epitaxial silicon layer;

forming a polysilicon emitter structure, of a first conductivity type, on said base region, with a first portion of said polysilicon emitter structure located on said first portion of said base region, in said emitter trench, and with a second portion of said polysilicon emitter structure located on a portion of said second portion of said base region;

performing an anneal cycle to create a emitter region, of a first conductivity type, in the portions of said base region, directly underlying said polysilicon emitter structure, and resulting in a narrow base region, of a second conductivity type, in an area of said base region, located between said emitter region, and said epitaxial silicon layer;

forming insulator spacers on the sides of said second portion of said polysilicon emitter structure;

forming base contact regions, of a second conductivity type, in a portion of said first region of said semiconductor substrate, not covered by said polysilicon emitter structure, and not covered by said insulator spacers;

forming polysilicon contact structures, of a second conductivity type, overlying said base contact regions, and overlying a portion of said insulator isolation regions;

opening contact holes, in a planarized dielectric layer, with a first contact hole exposing a portion of the top surface of a polysilicon contact structure, a second contact hole exposing a top surface of a portion of said polysilicon emitter structure, and a third contact hole exposing a portion of said epitaxial silicon layer, in said second region of said semiconductor substrate;

forming a second trench, in said second region of said semiconductor substrate to be used as a collector trench; and forming a first metal structure in said first contact hole, forming a second metal structure in said second contact hole, and forming a third metal structure in said third contact hole, and in said second trench.

2. The method of claim 1, wherein said subcollector region, is an N type region, formed via ion implantation of arsenic, antimony, or phosphorous ions, at an energy between about 30 to 150 KeV, at a does between about 1E15 to 5E15 atoms/cm$^2$.

3. The method of claim 1, wherein said epitaxial silicon layer, is an N type, epitaxial silicon layer, grown to a thickness between about 1 to 10 um, and with a surface concentration between about 1E15 to 1E16 atoms/cm$^3$, deposited at a temperature between about 1000 to 1200° C., using either trichlorosilane, with the addition of arsine, or phosphorous, as a source.

4. The method of claim 1, wherein said first trench is said emitter trench, formed to a depth between about 0.5 to 2 um, in a portion of said first region of said semiconductor substrate, via an anisotropic RIE procedure, using $Cl_2$ or $SF_6$ as an etchant.

5. The method of claim 1, wherein said base region is a P type region, formed in said first region of said semiconductor substrate via ion implantation of boron ions, at an energy between about 10 to 30 KeV, at a dose between about 1E13 to 5E14 atoms/cm$^2$, and at an implant angle between about 0 to 60°.

6. The method of claim 1, wherein said polysilicon emitter structure, is an N type, polysilicon emitter structure, comprised from a polysilicon layer, obtained via LPCVD procedures, at a thickness between about 3000 to 8000 Angstroms, using silane as a source, and either doped in situ, during deposition via the addition of arsine to the silane source, or deposited intrinsically then doped via ion implantation of arsenic ions, at an energy between about 30 to 70 KeV, at a dose between about 5E15 to 2E16 atoms/cm$^2$.

7. The method of claim 1, wherein said anneal cycle, used to create said emitter region, is performed at a temperature between about 700 to 1000° C., for a time between about 10 to 120 min., in a nitrogen ambient, resulting in an emitter depth between about 500 to 1500 Angstroms.

8. The method of claim 1, wherein said narrow base region, is a P type region, located underlying said emitter region, is between about 300 to 2000 Angstroms in width.

9. The method of claim 1, wherein said insulator spacers are comprised of silicon oxide, formed from a silicon oxide layer, obtained via LPCVD or PECVD procedures, at a thickness between about 1000 to 3000 Angstroms, then subjected to an anisotropic RIE procedure, using $CHF_3$ as an etchant.

10. The method of claim 1, wherein base contact regions, are P type regions, obtained via ion implantation of boron or $BF_2$, at an energy between about 10 to 50 KeV, at a dose between about 1E15 to 3E15 atoms/cm$^2$.

11. The method of claim 1, wherein said polysilicon base contact structures, are P type structures, formed from a polysilicon layer, obtained via LPCVD procedures, at a thickness between about 3000 to 5000 Angstroms, and doped via ion implantation of boron or $BF_2$ ions, at an energy between about 30 to 80 KeV, and at a dose between about 1E15 to 3E15 atoms/cm$^2$, then patterned via an anisotropic RIE procedure, using $Cl_2$ or $SF_6$ as an etchant.

12. The method of claim 1, wherein said second trench, is a collector trench, formed to a depth between about 1 to 7 um, via anisotropic RIE procedures using $Cl_2$ or $SF_6$ as an etchant.

13. A method of forming a bipolar junction transistor, on a semiconductor substrate, featuring a narrow base region, located underlying a polysilicon emitter structure, that in turn is located in an emitter trench, in said semiconductor substrate, comprising the steps of:

forming a heavily doped, N type subcollector region, in said semiconductor substrate;

growing an N type, epitaxial silicon layer, on said heavily doped, N type subcollector region;

forming deep trench isolation regions in said semiconductor substrate, and through said heavily doped, N type subcollector region, partitioning a region of said semiconductor substrate, to be used for said bipolar junction transistor;

forming field oxide regions to isolate a first region of said semiconductor substrate, between a first field oxide region, and a second field oxide region, to be used for a base region of said bipolar junction transistor, and to isolate a second region of said semiconductor substrate, between said second field oxide region, and a third field oxide region, to be used for a collector region of said bipolar junction transistor;

forming said emitter trench in a portion of said first region of said semiconductor substrate;

forming a P type base region in exposed surfaces of said first region of said semiconductor substrate, including formation of said P type base region in exposed surfaces of said emitter trench;

forming a N type, polysilicon layer;

depositing a first insulator layer;

patterning of said first insulator layer, and of said N type, polysilicon layer, to form a polysilicon emitter structure, capped with an insulator shape, with a first portion of said polysilicon emitter structure, overlying the portion of P type base region, located in said emitter trench, and with a second portion of said polysilicon emitter structure overlying a portion of said P type base region, located on the top surface of said N type, epitaxial silicon layer;

performing an anneal cycle to form a N type emitter region, in a top portion of said P type base region, directly underlying said polysilicon emitter structure, and resulting in the formation of a narrow width, P type base region, located between said N type, emitter region, and said N type, epitaxial silicon layer;

forming insulator spacers on the exposed sides of said emitter structure;

forming P type base contact regions in areas of said first region of said semiconductor substrate, not covered by said polysilicon emitter structure, and not covered by said insulator spacers;

forming P type, polysilicon structures, with a first P type, polysilicon structure overlying a first P type base contact region, and overlying a portion of said first field oxide region, and with a second P type, polysilicon structure, overlying a second P type, base contact region, and overlying a portion of said second field oxide region;

depositing a second insulator layer;

planarizing said second insulator layer;

forming a base contact hole, in said second insulator layer, exposing a portion of said first P type, polysilicon structure; forming an emitter contact hole, in said second insulator layer, exposing a portion of said polysilicon emitter structure; and forming a collector contact hole, in said second insulator layer, exposing a portion of said N type, epitaxial silicon layer, located in said second region of said semiconductor substrate;

forming a collector trench in said second region of said N type, epitaxial silicon layer, directly underlying said collector contact hole;

depositing a metal layer; and patterning of said metal layer to form: a first metal structure, located in said base contact hole; a second metal structure, located in said emitter contact hole; and a third metal structure, located in said collector contact hole, and in said collector trench.

14. The method of claim 13, wherein said heavily doped, N type subcolllector region is formed via ion implantation of arsenic, antimony, or phosphorous ions, at an energy between about 30 to 150 KeV, at a dose between about 1E15 to 5E15 atoms/cm$^2$.

15. The method of claim 13, wherein said N type, epitaxial silicon layer, is grown at a temperature between about 1000 to 1200° C., to a thickness between about 1 to 10 um, using trichlorosilane, with the addition of arsine as a source, resulting in a surface concentration for said N type, epitaxial silicon layer between about 1E15 to 5E16 atoms/cm$^3$.

16. The method of claim 13, wherein said emitter trench is formed to a depth between about 0.5 to 2 um, in said first region of said semiconductor substrate, via an anisotropic RIE procedure, using $Cl_2$ or $SF_6$ as an etchant.

17. The method of claim 13, wherein said P type base region is formed via an ion implantation procedure, using boron ions, at an energy between about 10 to 30 KeV, at a dose between about 1E13 to 5E14 atoms/cm$^2$, and at an implant angle between about 0 to 60°.

18. The method of claim 13, wherein said N type, polysilicon layer, used for said polysilicon emitter structure, is obtained via LPCVD procedures, at a thickness between about 3000 to 8000 Angstroms, and either doped in situ, during deposition, via the addition of arsine to a silane ambient, or the polysilicon layer is deposited intrinsically then doped via ion implantation of arsenic ions, at an energy between about 30 to 70 KeV, at a dose between about 5E15 to 2E16 atoms/cm$^2$.

19. The method of claim 13, wherein said anneal cycle, used to create said N type emitter region, is performed at a temperature between about 700 to 1000° C., for a time between about 10 to 120 min a nitrogen ambient.

20. The method of claim 13, wherein the depth of said N type emitter region is between about 500 to 15000 Angstroms.

21. The method of claim 13, wherein the width of said narrow width, P type base region, located between said N type emitter region, and said N type, epitaxial silicon layer, is between about 300 to 2000 Angstroms.

22. The method of claim 13, wherein said P type base contact regions are formed via ion implantation of boron, or $BF_2$ ions, at an energy between about 10 to 50 KeV, at a dose between about 1E15 to 3E15 atoms/cm.

23. The method of claim 13, wherein said P type, polysilicon structures are formed from a polysilicon layer, obtained via LPCVD procedures, to a thickness between about 3000 to 5000 Angstroms, doped via an ion implantation procedure, using boron, or $BF_2$ ions, at an energy between about 30 to 80 KeV, at a dose between about 1E15 to 3E15 atoms/cm$^2$, then patterned via an anisotropic RIE procedure, using $Cl_2$ or $SF_6$ as an etchant.

24. The method of claim 13, wherein said collector trench is formed to a depth between about 1 to 7 um, via an anisotropic RIE procedure, using $Cl_2$ or $SF_6$ as an etchant.

25. The method of claim 13, wherein said metal layer, used to form said first metal structure, said second metal structure, and said third metal structure, is either an aluminum based metal layer, containing copper, and silicon, obtained via plasma deposition procedures, at a thickness between about 5000 to 10000 Angstroms, or a tungsten layer, obtained via chemical vapor deposition procedures, again at a thickness between about 5000 to 10000 Angstroms.

* * * * *